US008896972B2

(12) United States Patent
Gao et al.

(10) Patent No.: US 8,896,972 B2
(45) Date of Patent: Nov. 25, 2014

(54) MAGNETIC READ HEAD WITH A READ FUNCTION FEATURE

(75) Inventors: Kaizhong Gao, Eden Prairie, MN (US); Xilin Peng, Walbridge, OH (US); Zhongyan Wang, San Ramon, CA (US); Yonghua Chen, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 576 days.

(21) Appl. No.: 12/702,045

(22) Filed: Feb. 8, 2010

(65) Prior Publication Data

US 2011/0194213 A1 Aug. 11, 2011

(51) Int. Cl.
*G11B 5/33* (2006.01)
*G11B 5/127* (2006.01)
*G11B 5/39* (2006.01)
*H01L 43/08* (2006.01)

(52) U.S. Cl.
CPC .............. *G11B 5/398* (2013.01); *G11B 5/3912* (2013.01); *H01L 43/08* (2013.01)
USPC .................................................... 360/324.12

(58) Field of Classification Search
CPC ...................................................... G11B 5/3903
USPC ........................ 360/324.12, 324.1, 324.2, 324
See application file for complete search history.

(56) References Cited

U.S. PATENT DOCUMENTS 6,510,031 B1 * 1/2003 Gambino et al. ............. 360/324
6,826,011 B1 11/2004 Haftek
7,085,111 B2 * 8/2006 Freitag et al. ............ 360/324.12
2005/0219764 A1 10/2005 Kameda et al.
2006/0002019 A1 1/2006 Guthrie et al.
2009/0080106 A1 * 3/2009 Shimizu et al. ................ 360/75

FOREIGN PATENT DOCUMENTS

| JP | 2004-206822 A | 7/2004 |
| JP | 2005-293693 A | 10/2005 |
| JP | 2006-196142 A | 7/2006 |
| JP | 2007-074522 A | 3/2007 |
| JP | 2007/074522 A1 | 7/2007 |
| JP | 2008-181580 A | 8/2008 |

OTHER PUBLICATIONS

English translation of Office Action issued by the Japanese Patent Office for Japanese Patent Application No. 2011-025211 entitled Magnetic Read Head.
Office Action issued by the Japanese Patent Office for Japanese Patent Application No. 2011-025211 entitled Magnetic Read Head, Jan. 15, 2013.

* cited by examiner

*Primary Examiner* — Joseph Feild
*Assistant Examiner* — Gustavo Polo
(74) *Attorney, Agent, or Firm* — Hall Estill Attorneys at Law

(57) ABSTRACT

In some examples, a system comprising a data storage member including a magnetic storage medium, the magnetic storage medium having a plurality of magnetic bit domains aligned on at least one data track, where a transition boundary between respective magnetic bit domains defines a transition curvature. The system may further comprise a magnetic read head including a first shield layer, a second shield layer, and a read sensor stack provided proximate to the first and second shield layers, where the magnetic read head senses a magnetic field of each of the plurality of magnetic bit domains according to a read playback sensitivity function. In some examples, the shield layers and read sensor stack may be configured to provide a reader playback sensitivity function that substantially corresponds to the shape of the respective magnetic bit domains.

20 Claims, 13 Drawing Sheets

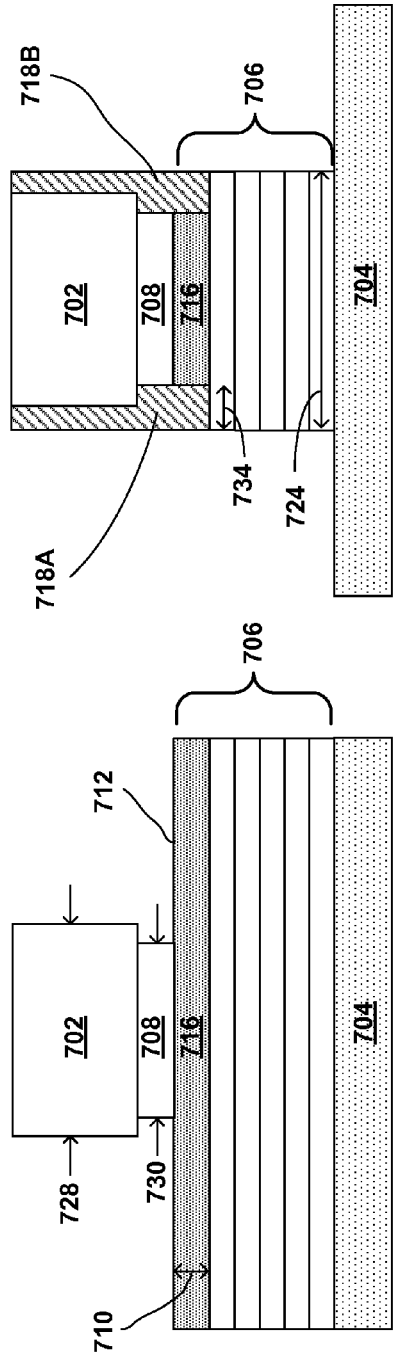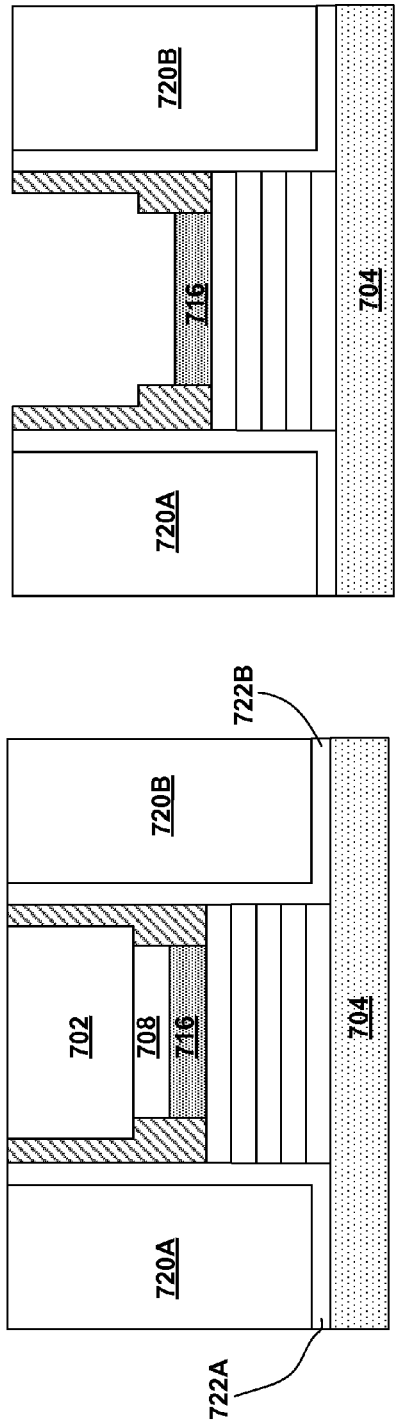

MAGNETIC READ HEAD WITH A READ FUNCTION FEATURE

BACKGROUND

Magnetic data storage devices generally include magnetic recording heads, which detect and modify the magnetic properties of a magnetic storage medium to store data. For example, a recording head may include a write head that "writes" data by magnetically orienting discrete domains of a magnetic storage medium, generally into one of two magnetic directions to represent a value of either "0" or "1". In general, the respective magnetically oriented domains are aligned on data tracks which divide the magnetic storage medium. The recording head may further include a read head that "reads" data by detecting the varying magnetic fields emanating from the respective discrete domains on the magnetic storage medium.

To increase the storage capacity of magnetic data storage devices, the width of the respective data tracks, i.e., track pitch, of magnetic storage mediums have been narrowed such that the areal density of the magnetic storage medium has increased. However, as the track pitch has narrowed, the degree of curvature at the transition boundary between the magnetic domains i.e., transition curvature, which correspond to individual bits of data written to each track to store data has increased. In some cases, the resolution of the data playback process by a read head may be reduced due to the presence and degree of transition curvature of the bits written to a data track.

SUMMARY

The disclosure is directed to a system comprising a data storage member including a magnetic storage medium, the magnetic storage medium having a plurality of magnetic bit domains aligned on at least one data track, wherein a transition boundary between respective magnetic bit domains defines a transition curvature. The system further comprises a magnetic read head comprising a first shield layer; a second shield layer; and a read sensor stack provided proximate to the first and second shield layers, wherein the read head senses a magnetic field of each of the plurality of magnetic bit domains according to a read playback sensitivity function, wherein at least the shield layers and read sensor stack are configured to provide a reader playback sensitivity function that substantially corresponds to a shape of the respective magnetic bit domains.

The details of one or more embodiments of the disclosure are set forth in the accompanying drawings and the description below. These and various other features and advantages will be apparent from a reading of the following detailed description.

BRIEF DESCRIPTION OF DRAWINGS

FIGS. 7A-7F illustrate an exemplary technique that may be utilized to fabricate the example read head of FIG. 6 according to one embodiment of the disclosure.

DETAILED DESCRIPTION

In general, the disclosure is directed to systems, devices and methods for sensing magnetic fields, e.g., as related to magnet storage applications. For example, magnetic read heads configured to provide tailored reader playback sensitivity functions are described. A read head may detect a magnetic field emanating from a magnetic storage medium according to the reader playback sensitivity function associated with the read head. Such read heads may be incorporated in the one or more magnetic recording heads utilized in a hard disc drive. However, while embodiments of the disclosure describe the sensing of magnetic fields with respect to read heads used in hard disc drives, embodiments are not limited to such applications, but instead may also be incorporated in other suitable applications, such as those applications in which it is desirable to precisely detect magnetic fields.

Figure 1:
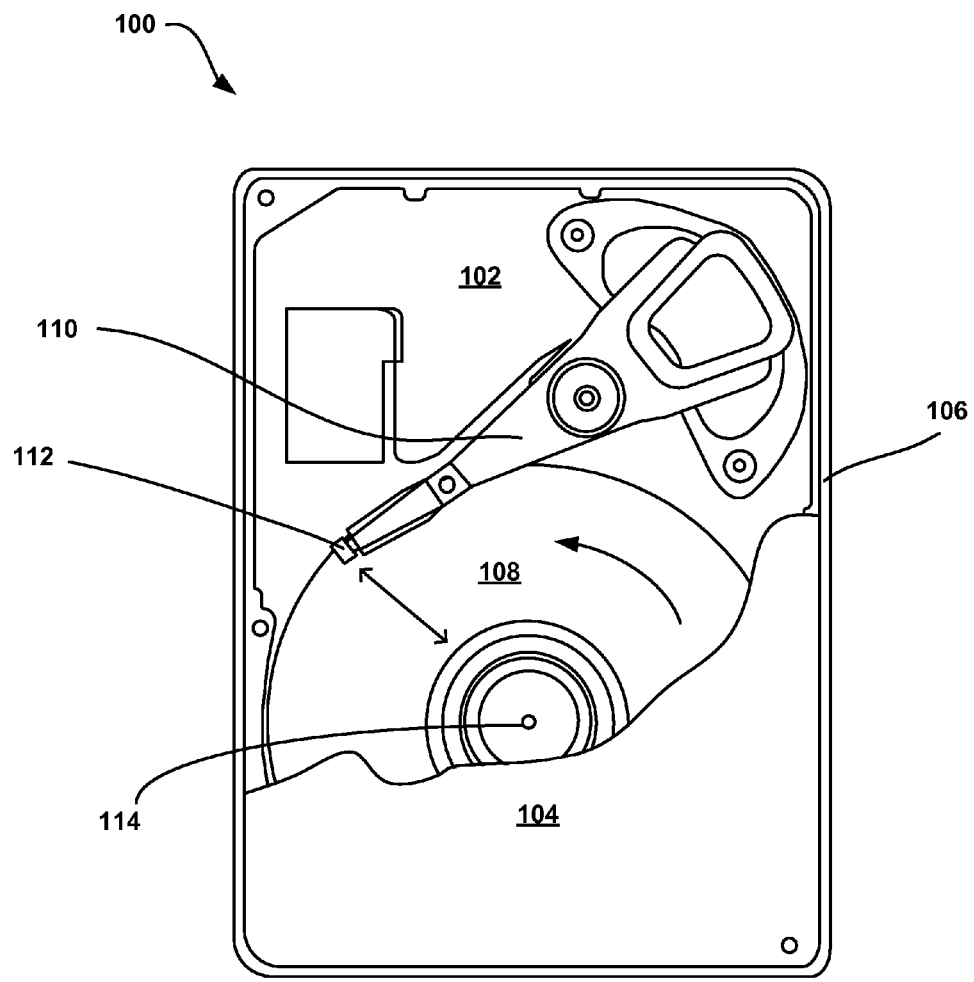
FIG. 1 is a schematic diagram of an exemplary magnetic hard disc drive including an example magnetic read/write head according to one aspect of the disclosure.

FIG. 1 illustrates an exemplary magnetic hard disc drive 100 including an example magnetic recording head 112 according to one aspect of the disclosure. Disc drive 100 includes base 102 and top cover 104, shown partially cut away. Base 102 combines with top cover 104 to form the housing 106 of disc drive 100. Disc drive 100 also includes one or more magnetic storage members that include a magnetic storage medium, which in FIG. 1 are one or more rotatable magnetic data discs 108 that include a magnetic storage medium. Data discs 108 are attached to spindle 114, which operates to rotate discs 108 about a central axis. Magnetic recording head 112 is adjacent to data discs 108. Actuator arm 110 carries magnetic recording head 112 for communication with each of the data discs 108.

Magnetic recording head 112 includes a write head (not shown) that can write data to data discs 108 by generating magnetic fields sufficient to magnetize discrete domains of the magnetic storage medium of data discs 108. As used herein, each of these discrete domains on the magnetic medium may be known as a magnetic bit domain. The magnetic storage medium of data disc 108 is divided into a plurality of concentric circular data tracks in which the magnetic bit domains are aligned.

Magnetic recording head 112 also includes a read head (not shown) that is capable of detecting the magnetic fields of the bit domains of the magnetic storage medium. For example, a read head may include a read sensor that senses the magnetic field of a bit domain. As the magnetic field sensed by the read sensor changes, so does the resistance of a current applied across the read sensor. Based on the change in resistance, the read head is able to detect the magnetic orientation of the bit domains of a magnetic storage medium, which may correspond to either a value of "0" or "1". In this manner, data discs 108 may store information as magnetically oriented bits which may be written and read by recording head 112.

Figure 2:
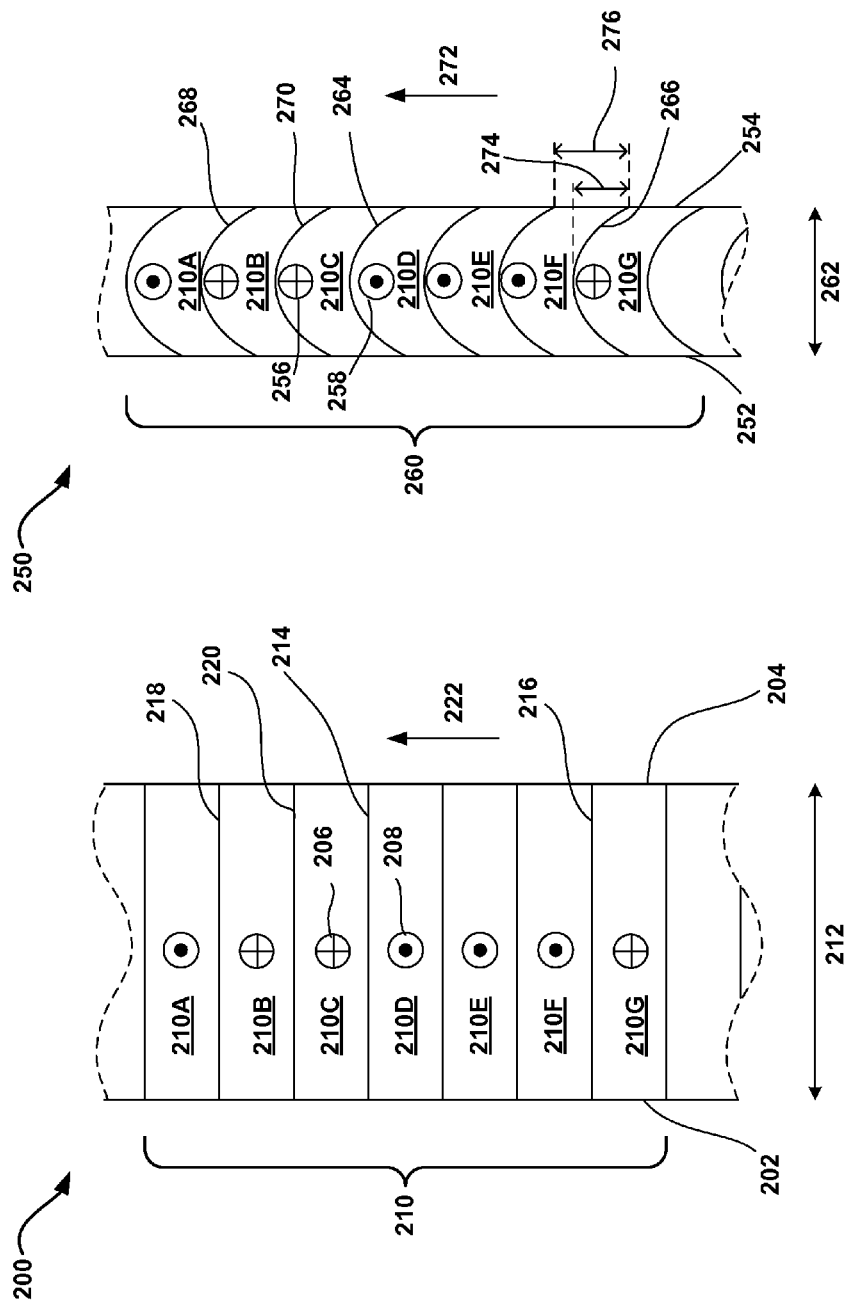
FIGS. 2A and 2B are schematic diagrams illustrating portions of two example data tracks.

FIGS. 2A and 2B are schematic diagrams illustrating portions of two exemplary data tracks. Specifically, FIG. 2A illustrates a portion of data track 200 and FIG. 2B illustrates a portion of data track 250. Data tracks 200 and 250 are examples of data tracks that may divide a magnetic storage medium, such as, e.g., magnetic data disc 108 of FIG. 1.

Referring to FIG. 2A, data track 200 is one of a plurality of concentric circular data tracks that divide the magnetic storage medium of a magnetic data disc. Accordingly, sides 202 and 204 of data track 200 may be next to, or form the side of the other similar data tracks dividing the magnetic storage medium. As illustrated, a plurality of magnetic bit domains 210 including individual magnetic bit domains 210A-210G are aligned on data track 200. Each of the plurality of magnetic bit domains spans the entire width 212 of data track 200, which may be referred to as the track pitch.

Further, each respective bit domain (210A-210G) exhibits a magnetic field substantially in one of two magnetic orientations, e.g., as a result of being magnetically oriented by a write head. For example, magnetic bit domains 210C has a magnetic orientation that is substantially opposite to the magnetic orientation of magnetic bit domain 210D, as indicated by arrow tail 206 and arrow head 208 (e.g., into and out of the plane of FIG. 2B).

Magnetic bit domain 210C and magnetic bit domain 210D are separated by boundary 214. In accordance with the respective magnetic orientations of bit domain 210C and 210D, boundary 214 may be considered a transition boundary to the extent that boundary 214 represents a transition from one magnetic orientation to a substantially opposite orientation as compared to boundary 220 which separates magnetic bit domains 210B and 210C that have like magnetic orientations. Similarly, boundaries 218 and 216 are also transition boundaries, as indicated by the respective magnetic orientation indicators in FIG. 2A.

Referring to FIG. 2B, data track 250 is one of a plurality of concentric circular data tracks that divide the magnetic storage medium of a data disc, e.g., data disc 108 of FIG. 1. Accordingly, sides 252 and 254 of data track 250 may be next to, or form the side of the other similar data tracks dividing the magnetic storage medium. As illustrated, a plurality of magnetic bit domains 260 including individual magnetic bit domains 260A-260G are aligned on data track 250. Each of the plurality of magnetic bit domains spans the entire width 262 of data track 250.

Similar to magnetic bit domains 210A-210G, each respective bit domain 260A-260G in track 250 exhibits a magnetic field substantially in one of two magnetic orientations, e.g., as a result of being magnetically oriented by a write head. For example, magnetic bit domains 260C has a magnetic orientation that is substantially opposite to the magnetic orientation of magnetic bit domain 260D, as indicated by arrow tail 256 and arrow head 258 (e.g., into and out of the plane of FIG. 2B).

Magnetic bit domain 260C and magnetic bit domain 260D are separated by boundary 264. In accordance with the respective magnetic orientations of bit domain 260C and 260D, boundary 264 may be considered a transition boundary to the extent that boundary 264 represents a transition from one magnetic orientation a substantially opposite orientation as compared to boundary 270 which separates magnetic bit domains 260B and 260C that have like magnetic orientations. Similarly, boundaries 268 and 266 are also transition boundaries, as indicated by the respective magnetic orientation indicators in FIG. 2B.

Although FIGS. 2A and 2B illustrate transition boundaries 214, 216, 218, 264, 266 and 268 as distinct, smooth boundary lines separating a bit domain of one magnetic orientation from another, it is recognized that magnetic boundaries between magnetic bit domains are not necessarily oriented as such. For example, in some cases, magnetic bit domains may include a plurality of magnetic grains in which substantially all of the magnetic grains have the same magnetic orientation. Transition boundaries may be formed along the boundaries of oppositely oriented grains according to the shape of the boundary formed by individual grains. Accordingly, in some examples, a transition boundary may not be a smooth line, but instead a meandering boundary that is approximated by a smooth line such as that shown in FIGS. 2A and 2B. As a result, boundaries 214, 216, 218, 264, 266 and 268 may only represent the general shape of the magnetic transition between magnetic bit domains formed by individual magnetic grains having substantially opposite magnetic orientations aligned on a data track.

Notably, as illustrated by FIG. 2A, transition boundaries 214, 216, and 218 extend across the width 212 of data track 200 in substantially a straight line. Conversely, as illustrated by FIG. 2B, transition boundaries 264, 266, and 268 do not extend substantially straight across the width 262 of data track 250, but instead form a curved transition boundary which spans the width 262 of data track 250. Such a curvature may be generally known as a transition curvature.

Figure 3:
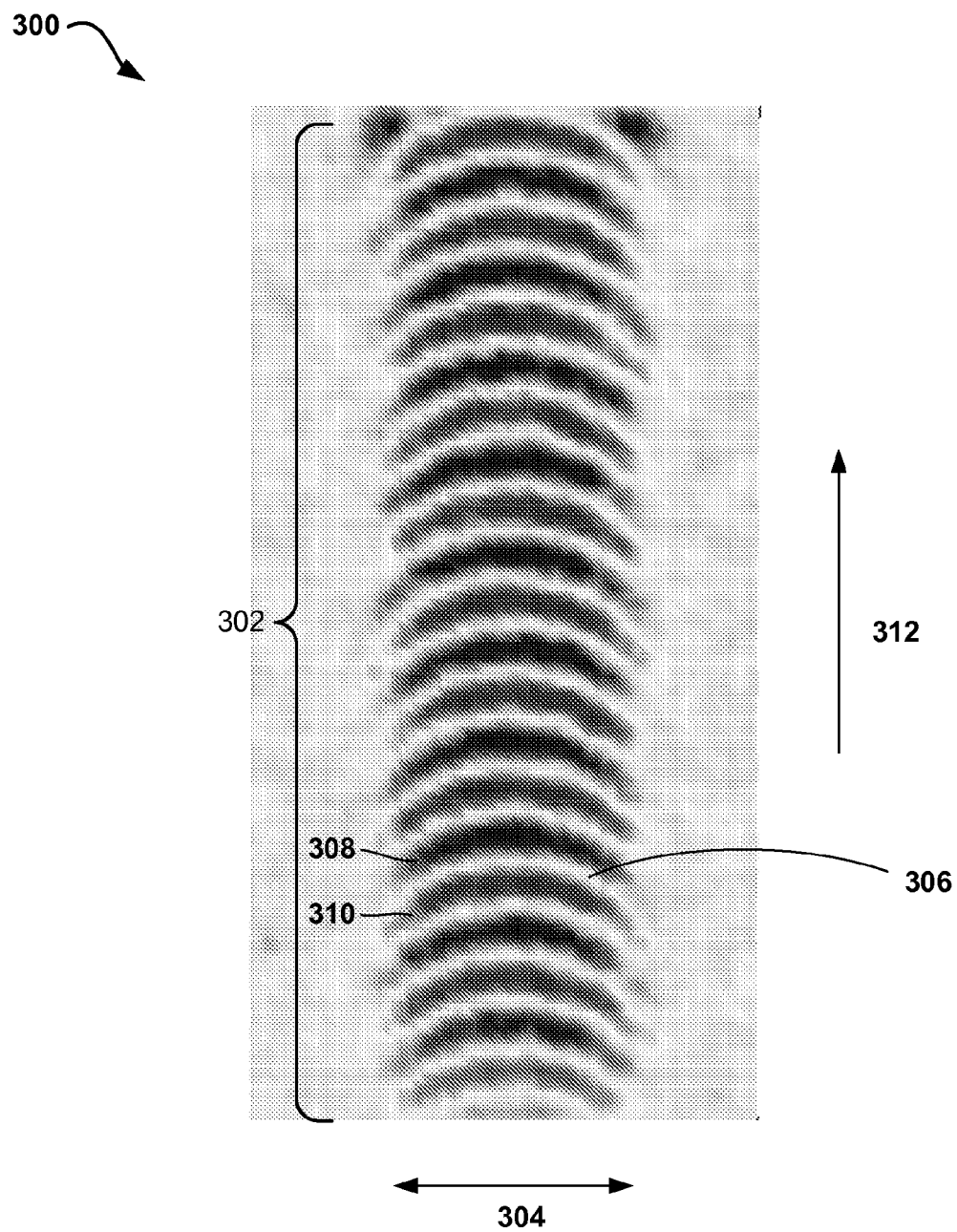
FIG. 3 is a micro-magnetic simulation diagram illustrating an example magnetic data track having curved transition boundaries.

As another example of curved transition boundaries, FIG. 3 is a micro-magnetic simulation diagram illustrating example magnetic data track 300 having curved transition boundaries. Data track 300 includes a plurality of magnetic bit domains 302 in which the magnetic orientation of each respective magnetic bit domains alternates sequentially between substantially opposite magnetic fields. The magnetic fields associated with the plurality of magnetic bit domains 302 are approximately indicated by the relative color shown in FIG. 3, the darker areas indicating a relatively strong magnetic field in one of two substantially opposite magnetic orientations and the lighter areas separating the individual magnetic bit domains corresponding to transition boundaries.

Each transition boundary, e.g., transition boundary 306 separating magnetic bit domain 308 and magnetic bit domain 310, extends across the width 304 of data track 300. Moreover, each transition boundary is not a straight boundary but instead exhibits a transition curvature. In this case, the transition boundary is curved in the read direction 312 (which will be described in further detail below with respect to data tracks 200 and 250) of data track 300. As illustrated in the example of FIG. 3, the degree of transition curvature of each of the respective transition boundaries is substantially equal throughout the data track.

In this case, the plurality of magnetic bit domains 302 aligned on data track 300 may have been oriented by a perpendicular write head. However, curved transition boundaries may be exhibited by magnetic bit domains written by types of write heads other than perpendicular write heads, e.g., write head capable of orienting magnetic bit domains on a data track in bit densities that produce curved transition boundaries. In some examples, write heads without screw angle control will orient the magnetic domain such that curved transition boundaries are exhibited, as precise control of the screw angle may be very challenging.

In general, curved transition boundaries may be exhibited by data tracks containing aligned magnetic bit domains. The presence of curved transition boundaries and the degree of transition curvature on a data track may result from a number of factors. In some cases, curved transition boundaries between magnetic bit domains may be related to the width of the data track on which the magnetic bit domains are aligned. For example, with reference to FIGS. 2A and 2B, the width 262 of track 250 is relatively less than the width 212 of track 200. In some embodiments, width 262 of track 260 may range from approximately 10 nanometers to approximately 150 nanometers, such as approximately 10 nanometers to approximately 100 nanometers, or approximately 30 to approximately 60 nanometers, or approximately 75 nanometers to approximately 150 nanometers.

Further, the degree of transition curvature may be related to the width of a data track. In some cases, the degree of curvature of a curved transition boundary may increase as the relative width of a data track decreases. For example, the curved transition boundaries between magnetic bit domains on a data track may exhibit a greater degree of curvature compared to the degree of curvature exhibited by curved transition boundaries on a data track with a relatively greater track width.

In some examples, the degree of transition curvature exhibited by transition boundaries between magnetic bit domains by may be expressed with respect to a comparison of lengths 274 and 276, shown in FIG. 2B. As shown, length 274 approximately corresponds to the greatest distance with respect to any point along the transition boundary in the read direction, e.g., the nexus of curved transition boundary 266, furthest from the approximate point in the read direction in which boundary 266 meets track side 254. Length 276 approximately corresponds to the total length of an individual bit domain measure, e.g., the approximate length of magnetic bit domain 210F in the read direction.

The transition curvature exhibited by magnetic bit domains on a data track included on a magnetic storage medium may vary in embodiments of the disclosure. For example, with reference to lengths 274 and 276 on data track 250 of FIG. 2B, length 274 with respect to length 276 in an embodiment of the disclosure may be greater than, equal to, or less than other embodiments of the disclosure. In some examples, length 274 may range from approximately 5 percent to approximately 300 percent of length 276, such as approximately 20 percent to approximately 300 percent of length 276, or approximately 30 percent to approximately 50 percent of length 276.

As previously described, a magnetic read/write head typically includes a read head that detects the magnetic fields of the respective bit domains on a magnetic storage medium. For example, with reference to FIGS. 2A and 2B, the magnetic fields emanating from the plurality of magnetic bit domains 210 and 260 aligned in data tracks 200 and 250, respectively, may be detected by a read head located proximate to the air bearing surface of the data discs which contain the respective data tracks. Data tracks 200 and 250 may be moved relative to a read head in substantially the read direction indicated by arrows 222 and 272, respectively, e.g., by rotating data disc 108 attached to spindle 114 about a central axis relative to recording head 112, as illustrated in FIG. 1. As described previously, a read head may include a read sensor that senses the magnetic field of a bit domain, e.g., plurality of magnetic bit domains 210 and 260 on data track 200 and 250, respectively, when the read sensor is properly aligned with respect to data tracks 200 and 250. By moving data track 200 or 250 relative to a read head and, therefore, the read sensor of the read head, read sensor senses changes in the magnetic field that result from a differences in the magnetic orientation of the plurality of magnetic bit domains 210 or 260, respectively. For example, a read sensor may sense a change in magnetic field as data track 200 is moved relative to the read head such that the magnetic field sensed by the read sensor changes from the magnetic field of bit domain 210C to the magnetic field of bit domain 210D.

In general, a read head senses magnetic fields according to a read playback sensitivity function associated with the read head. For example, a read playback sensitivity function may represent the relative sensitivity of a read sensor to magnetic fields emanating from a magnetic storage medium with respect to the position relative the read sensor. In some cases, a read head may sense magnetic fields emanating from a magnetic storage medium according to a read playback sensitivity function that is approximately symmetrical with respect to both a longitudinal axis of the data track, and the track pitch direction, i.e., transverse direction, when aligned with a data track.

Figure 4:
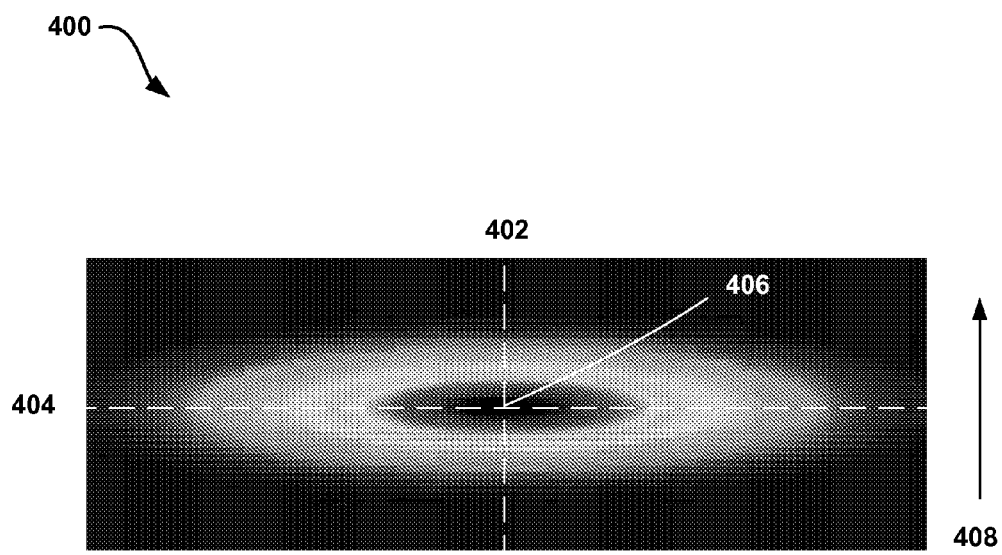
FIG. 4 is a plot illustrating an example read sensitivity function of an example read head.

FIG. 4 is a plot illustrating an example read playback sensitivity function. The exemplary read playback sensitivity function illustrated by plot 400 is substantially symmetrical along a first axis 402 and a second axis 404. In general, the relative degree of sensitivity of a read head which senses magnetic fields according to the read sensitivity function of FIG. 4 is represented in plot 400 based to the relative color of the plot. As indicated by plot 400, the relative sensitivity of the read head which senses magnetic fields according to the read playback sensitivity function of plot 400 is greatest at approximately the center 406 of the read sensitivity function, which in the case is approximately intersection of first axis 402 and second axis 404. Furthermore, as shown, the sensitivity of the read head decreases at varying rates moving away from center 406 of the read playback sensitivity function according to relative color illustrated in plot 400.

A read playback sensitivity function consistent with plot 400 may be suitable to sense the magnetic fields emanating from magnetic bit domains, e.g., such as magnetic bit domains that are also approximately symmetrical with respect to both the read direction and track width direction. For example, a read head which senses magnetic fields according to the read playback sensitivity function illustrated by plot 400 may be positioned to sense the magnetic fields of the plurality of magnetic bit domains 210 on track 200 of FIG. 2A. In some cases, a read head that senses magnetic fields according to the read playback sensitivity function illustrated by plot 400 may be positioned such that center 406 of the read playback sensitivity function is approximately centered on width 212 of data track 200, and oriented such that direction 408 is consistent with read direction 222. As such, first axis 402 may be a longitudinal axis and second axis 404 may be a transverse axis with respect to data track 200.

However, a read head which senses magnetic fields according to a read playback sensitivity function such as that illustrated by plot 400 may not always be desirable. In some cases, magnetic bit domains are not necessarily substantially symmetrical with respect to both read direction and track width direction. For example, as illustrated by FIG. 2B, curved transition boundary 264 influence magnetic bit domains 210B and 210C such that the shape of the respective bit domains are not symmetrical along a transverse axis of track 250.

Consequently, a read head which senses magnetic fields according a read playback sensitivity function that is inconsistent with the shape of magnetic bit domains aligned on a data track and/or the shape of the transition boundaries between respective bit domains may not possess a sufficient reader resolution to adequately read data stored on a data track containing the magnetic bit domains. In some examples, the signal to noise ratio in such cases may prevent a read head from adequately sensing transitions between magnetic bit domains, preventing read head from accurately reading data stored on the magnetic data track. For example, a read head that senses magnetic fields according to a read playback sensitivity function inconsistent with curved transition boundaries may sense an undesirable amount of the magnetic field of one or more magnetic bit domains proximate to an individual magnetic bit domain. As a result, the overall change in resistance of a current applied across the read sensor in the read head may not be adequate to detect the magnetic orientation, or transition thereof, of the respective magnetic bit domains on a data track, leading to an increase in bit error rate.

In accordance with aspects of the disclosure, a read head may be provided which senses magnetic fields according to a read playback sensitivity function that more suitably corresponds to magnetic bit domains having at least one curved transition boundaries.

As previously described, in one aspect, the disclosure relates to a system comprising a data storage member including a magnetic storage medium, the magnetic storage medium having a plurality of magnetic bit domains aligned on at least one data track, wherein a transition boundary between respective magnetic bit domains defines a transition curvature. The system further comprising a magnetic read head comprising a first shield layer; a second shield layer; and a read sensor provided proximate to the first and second shield layers, wherein the read head senses a magnetic field of each of the plurality of magnetic bit domains according to a read playback sensitivity function, wherein at least the shield layers and read sensor stack are configured to provide a reader playback sensitivity function that substantially corresponds to a shape of the respective magnetic bit domains.

In another aspect, the disclosure relates to a system comprising a data storage member including a magnetic storage medium, the magnetic storage medium having a plurality of magnetic bit domains aligned on at least a data track. The system further comprising a magnetic read head comprising a first shield layer; a second shield layer; and a read sensor provided substantially between the first and second shield layers, wherein the shield layers and read sensor are configured to provide a reader playback sensitivity function, wherein the read head senses a magnetic field of the respective magnetic bit domains contained on the magnetic storage medium according to the reader playback sensitivity function, wherein the reader playback sensitivity function is approximately asymmetrical along a transverse axis of the data track.

In still another aspect, the disclosure relates to a system comprising a data storage member including a magnetic storage medium, the magnetic storage medium having a plurality of magnetic bit domains aligned on at least a data track, wherein a transition boundary between respective magnetic bit domains defines a transition curvature. The system further comprising a read head comprising means for creating a reader playback sensitivity function associated with the magnetic read head, wherein the reader playback sensitivity function substantially corresponds to a shape of the respective magnetic bit domains.

Figure 5:
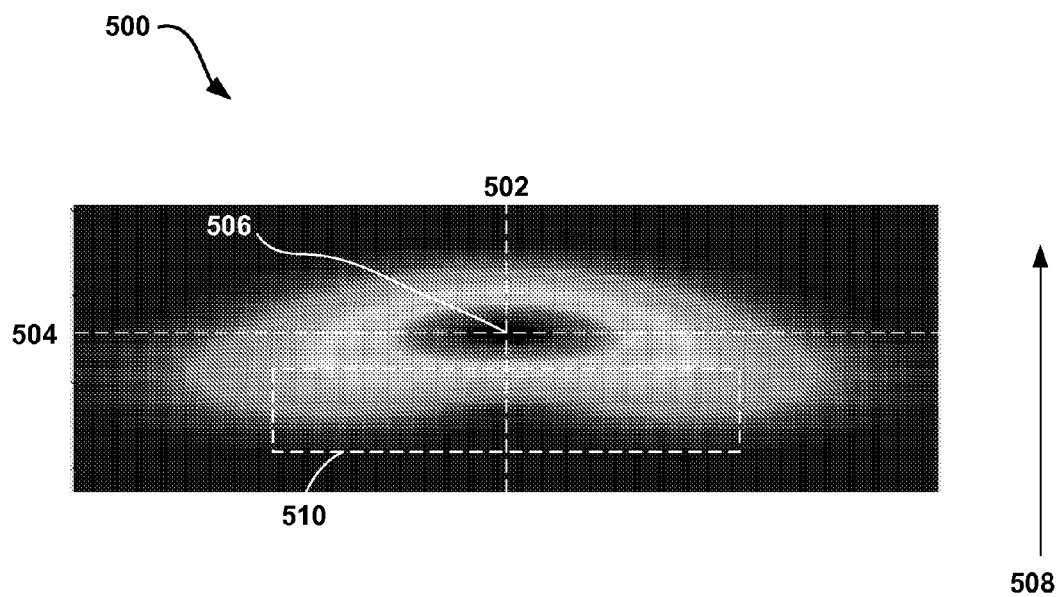
FIG. 5 is a plot illustrating an example read sensitivity function of an example read head according to one embodiment of the disclosure.

FIG. 5 is a plot illustrating an example read playback sensitivity function according to the disclosure. In accordance with some embodiments of the disclosure, the read sensitivity function illustrated by plot 500 corresponds to a magnetic bit domain that has at least one curved transition boundary. As shown, the read playback sensitivity function illustrated by plot 500 is substantially symmetrical with respect to first axis 502. Contrary to the read playback sensitivity function illustrated by plot 400 of FIG. 4, the read playback sensitivity function illustrated by plot 500 is substantially asymmetrical with respect to second axis 504.

As indicated by plot 500, the relative sensitivity of the read head which senses magnetic fields according to the read playback sensitivity function of plot 500 is greatest at approximately point 506 of the read sensitivity function and decreases at varying rates moving away from point 506 towards the outer boundaries of plot 500. Contrary to the read playback sensitivity function represented by plot 400, portion 510 of the outer boundary of plot 500 is substantially concave with respect to second axis 504. In some embodiments, such a curved boundary portion may substantially correspond to the transition curvature of a magnetic bit domain.

A read playback sensitivity function consistent with plot 500 may be suitable to sense the magnetic fields emanating from magnetic bit domains having one or more curved transition boundaries. In general, a read head may be configured to provide for read playback sensitivity function that substantially corresponds to the shape of magnetic bit domains having one or more curved transition boundaries. For example, a read head which senses magnetic fields according to a read playback sensitivity function consistent with plot 500 may be provided to sense the magnetic fields emanating from plurality of magnetic bit domains 260 aligned on data track 250 of FIG. 2B. In some embodiments, such a read head may be positioned such that center 506 of the read playback sensitivity function is approximately centered on width 262 of data track 250, and oriented such that direction 508 is consistent with read direction 272. When oriented as such, first axis 502 may be a longitudinal axis and second axis 504 may be a traverse axis with respect to data track 250.

Figure 6:
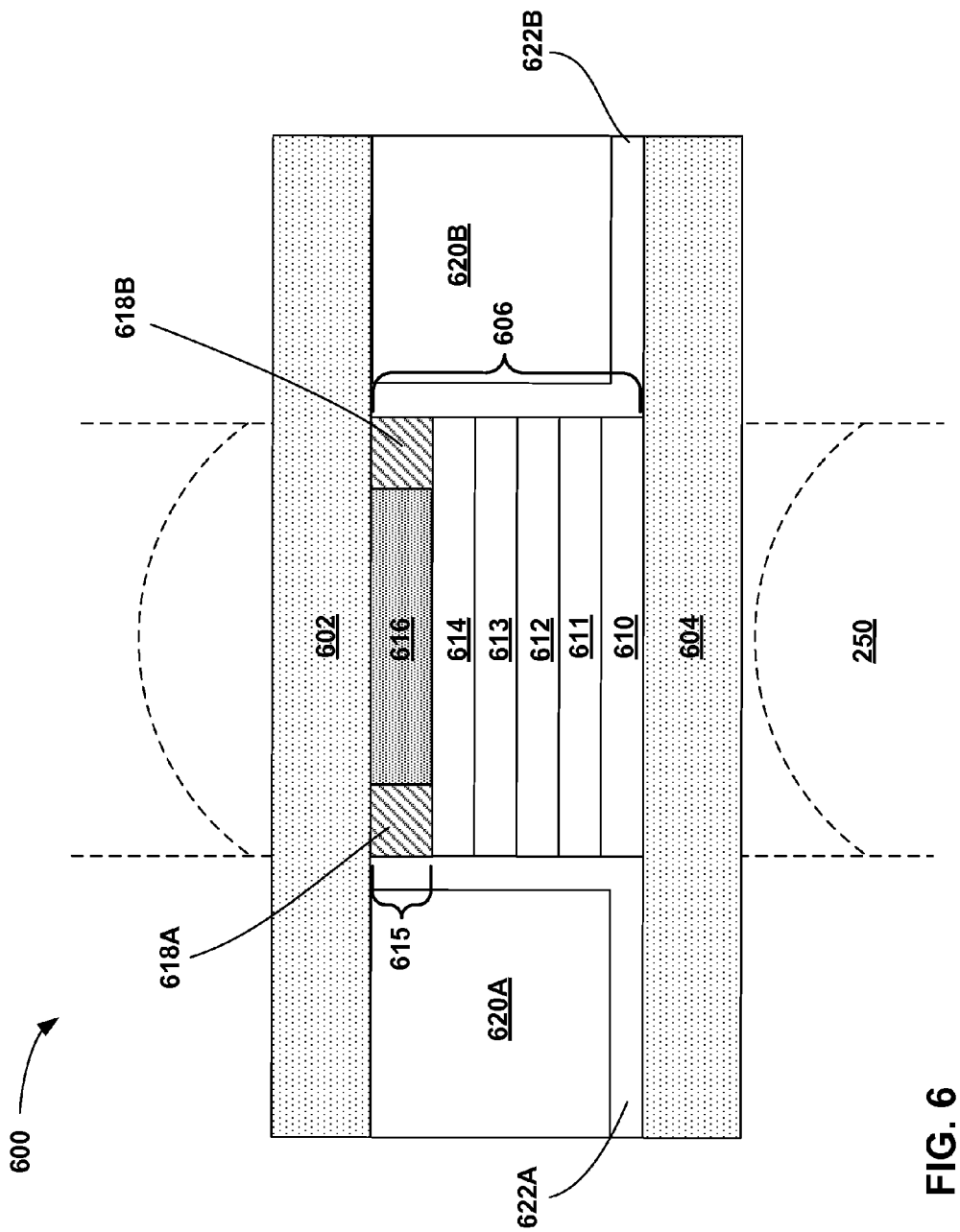
FIG. 6 is a schematic diagram illustrating an example read head according to one embodiment of the disclosure.

FIG. 6 is a schematic diagram illustrating an example read head according to one embodiment of the disclosure. Read head 600 includes first shield layer 602, second shield layer 604, read sensor stack 606 proximate to shield layers 602, 604, insulator layers 622A, 622B and permanent magnet (PM) layers 620A, 620B. As shown, read sensor stack 606 is provided substantially between first shield layer 602 and second shield layer 604. Insulator layers 622A, 622B is provided between read sensor stack 606 and PM layers 620A, 620B, respectively. Insulator layers 622A, 622B are also provided between second shield layer 604 and PM layers 620A, 620B, respectively.

As will be described, read head 600 may be utilized in a magnetic read/write head to read data contained on a magnetic storage medium in which the transition boundaries between magnetic bit domains define a transition curvature, such as, e.g., magnetic data track 250 of FIG. 2B. Data track 250 is included in FIG. 6 to conceptually illustrate the position of read head 600 relative to data track 250. Read head 600 may fly over the surface of data track 250 to read the data stored on magnetic storage medium by detecting the magnetic fields of the respective magnetic bit domains aligned on data track 250. For example, as configured in FIG. 6, magnetic read head 600 may provide means for creating a reader playback sensitivity function associated with the magnetic read head 600, where the reader playback sensitivity function substantially corresponding to a shape of the respective magnetic bit domains aligned on the data tracks of a magnetic storage medium. In some embodiments, the read playback sensitivity function may be similar to that represented by plot 500 of FIG. 5.

In general, the read playback sensitivity function that read head 600 senses magnetic fields from data track 250 according to may be influenced by the position of first and second shield layers 602, 604. In the embodiment illustrated in FIG. 6, first and second shield layers 602, 604 reduce or substantially block extraneous magnetic fields, such as, for example, those from adjacent magnetic bit domains on data track 250 from impacting read sensor stack 606.

Insulating layers 622A and 622B may include aluminum oxide and/or any other suitable material. PM layers 620A and 620B may include nickel-iron (NiFe) alloys, e.g., permalloy, and/or any other suitable material. Furthermore, as shown, read sensor stack 606 includes a plurality of individual layers 610-615, although the exact number of layer and the function of each layer may vary in embodiments of the disclosure. In this example, for example, layers 610 and 611 may be reference layers, layers 613 and 614 may be free layers.

Notably, read sensor stack 606 also includes cap layer 615 proximate to first shield layer 602. Cap layer 615 includes non-magnetic portion 616 located between magnetic portions 618A and 618B. In general, non-magnetic portion 616 may include a material which has a relatively low magnetic permeability. For example, suitable materials for non-magnetic portion 616 may include carbon or aluminum oxide, and combinations thereof, or any other suitable oxide, such as, e.g., oxides of silicon, such as silicon dioxide, nitrides and/or carbides. In contrast, magnetic portions 618A, 618B may include a material which has a relatively high magnetic permeability. For example, suitable materials for magnetic portions 618A, 618B may include nickel-iron (NiFe) alloys, e.g., permalloy, and/or iron-cobalt. Accordingly, in some embodiments, the magnetic permeability of magnetic portions 618A, 618B is greater than the magnetic permeability of non-magnetic portion 616.

The location of magnetic portions 618A, 618B in cap layer 615 substantially corresponds to the edges of data track 250 such that the respective portions influence the sensitivity of read head 600 at approximately the edges of data track 250. Further, the location of non-magnetic portion 616 in cap layer 615 substantially corresponds to the center portion of data track 250 such that non-magnetic portion 616 influences the sensitivity of read head 600 at approximately the center portion of data track 250. Due in part to the relatively high magnetic permeability of portions 618A, 618B of cap layer 615 corresponding to the edges of data track 250 and low magnetic permeability of portion 616 of cap layer 615 corresponding to the center portion of data track 250, the effective gap length sensitivity of read head 600 may be reduced. In this manner, cap layer 615, in combination with at least shield layers 602, 604 influences the read playback sensitivity function associated with read head 600.

Overall, as configured in FIG. 6, the read playback sensitivity function associated with read head 600 may substantially correspond to the shape the respective magnetic bit domains aligned on date track 250. For example, read head may sense magnetic fields according to a read playback sensitivity function such as the represented by plot 500 illustrated in FIG. 5. In some embodiments, cap layer 615 may provide for a read playback sensitivity function which has at least one boundary that corresponds to the curved transition boundary of the magnetic bit domains aligned on data track 250.

Read head 600 may be fabricated using any suitable technique that allows for a configuration substantially as shown in FIG. 6. For example, FIGS. 7A-7F illustrate an exemplary technique that may be utilized to fabricate read head 600 of FIG. 6.

Referring to FIG. 7A, a plurality of materials are deposited on a surface of shield layer 704 to form plurality of layers 706 which correspond to individual layers 610-614 and non-magnetic portion 616 of layer 615 that form read sensor stack 606 of FIG. 6. Shield layer 704 corresponds to second shield layer 604 of read head 600 of FIG. 6. Individual layers may be deposited as shown in FIG. 7, e.g., by any suitable technique known in the art.

In some embodiments, layer 716 includes carbon and may function as a CMP stop layer. Thickness 710 of layer 716 may vary depending on a number of factors, including the properties desired for the read head resulting from the fabrication process. For example, in some cases, thickness 710 of layer 716 may range from approximately 1 nanometer to approximately 50 nanometers, such as approximately 5 nanometers to approximately 10 nanometers.

Resist layer 708 is located between photoresist layer 702 and surface 712 of layer 716. As illustrated by FIG. 7A, width 730 of resist layer 708 is less than width 728 of photoresist layer 702, such that resist layer 708 is an undercut layer with respect to photoresist layer 702. Such a configuration may be accomplished utilizing any suitable technique. For example, surface 712 of layer 716 may coated with high solubility polydimethylglutarimide (PMGI), and the surface of the PMGI coating may subsequently be coated with photoresist. In some cases, the PMGI and/or photoresist coating may be applied using a spin coating procedure. The photoresist may then be exposed according to the desired width 728 of layer 702, and then developed along with the PMGI to form photoresist layer 702 and resist layer 708, including PMGI in this case, having an undercut configuration as shown in FIG. 7A.

Referring to FIG. 7B, argon ion milling may be used to remove a portion of the plurality of layers 706 such that the remaining portion of layers 706 has a width 724 corresponding to the width desired for the read sensor stack of the read head formed from the fabrication process. Redeposition layers 718A and 718E form as a result of the redeposition of a portion of the layer material being removed by the ion milling process. As shown in FIG. 7B, redeposition layers 718A, 718B occupy the undercut area formed by resist layer 708 and photoresist layer 702. Width 734 represents the recess of layer 716 from edge of remaining layers of reader stack 706. Although not limited to such dimensions, in some examples, length 724 may be approximately 50 nanometers to approximately 100 nanometers, and length 734 may range from approximately 5 nanometers to approximately 15 nanometers.

Referring to FIG. 7C, insulator material is deposited to form insulator layers 722A and 722B, and PM material is subsequently deposited to form PM layers 720A and 720B as shown in FIG. 7C.

Referring to FIG. 7D, photoresist layer 702 and resist layer 708 are removed, e.g., using a plasma ashing and/or lift-off process.

Figure 7E:
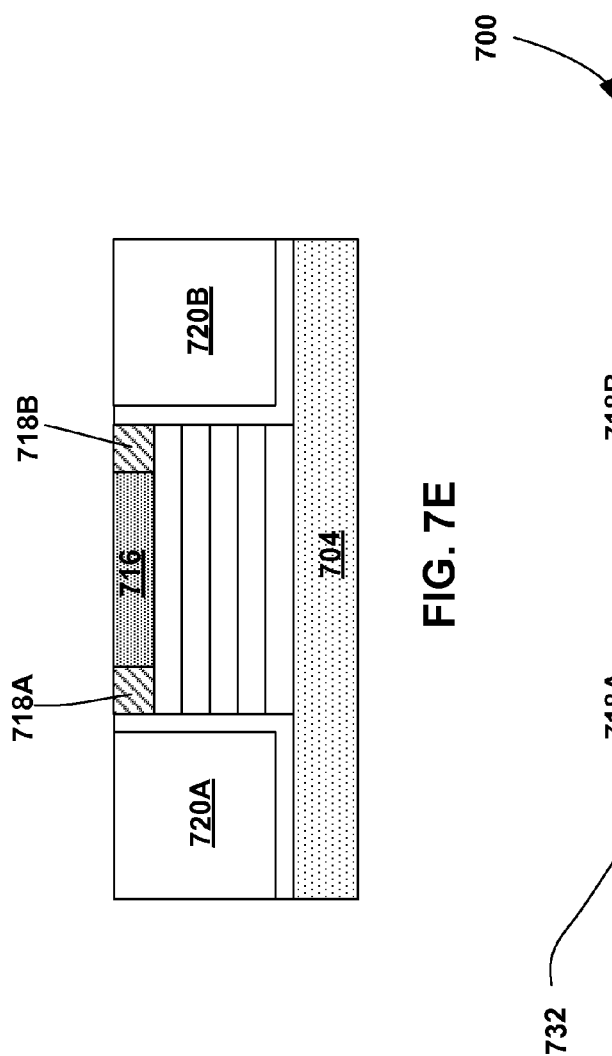

Referring to FIG. 7E, a touch-up CMP process is used to remove portions of PM layers 720A, 720B and redeposition layers 718A, 718B.

Figure 7F:
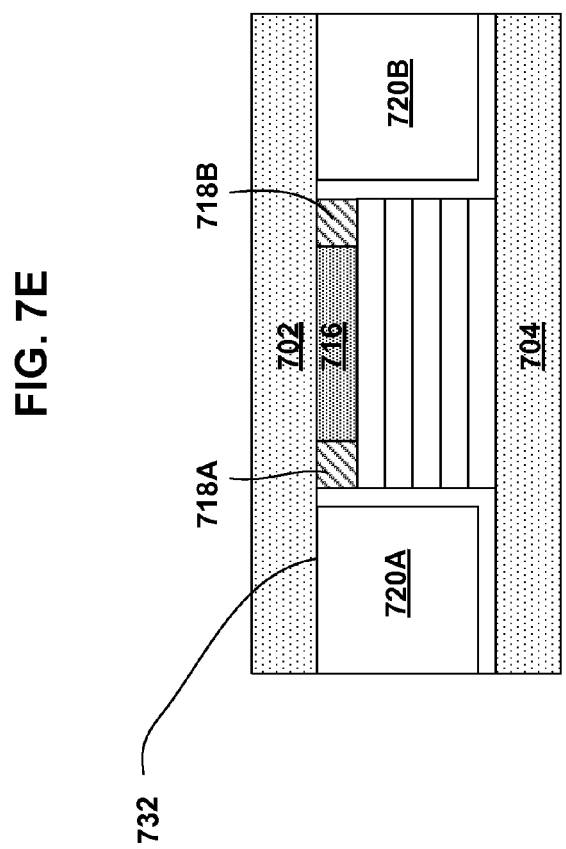

Referring to FIG. 7F, shield material is deposited on exposed surface 732 to form shield layer 702 which corresponds to first shield layer 602 of FIG. 6. The resulting read head 700 has substantially the configuration as read head 600 of FIG. 6. Accordingly, the exemplary technique illustrated by FIG. 7A-7F may be used to fabricate read head 600 of FIG. 6.

Figure 8:
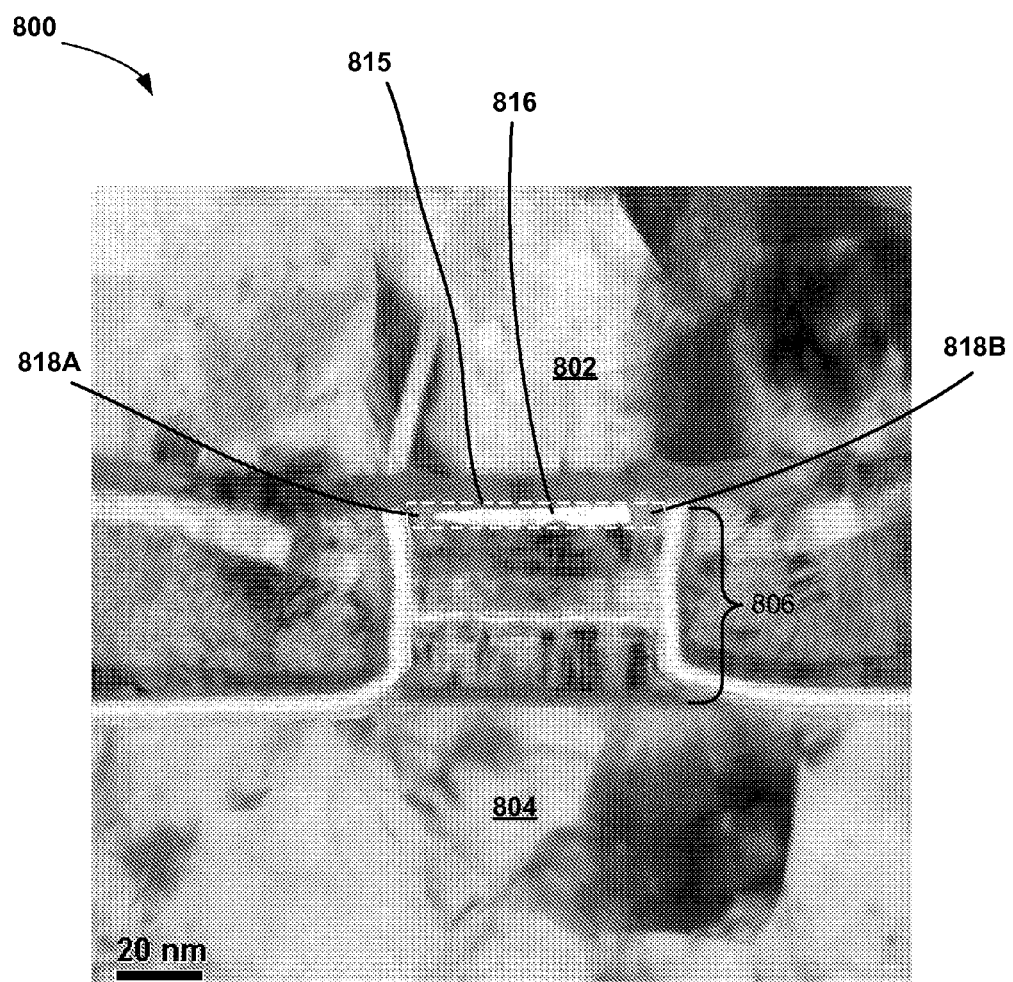
FIG. 8 is a transmission electron microscopy (TEM) micrograph of an exemplary read head substantially similar to the exemplary read head shown in FIG. 6 using the exemplary technique illustrated by FIGS. 7A-7F

FIG. 8 is a transmission electron microscopy (TEM) micrograph of an exemplary read head 800 substantially similar to read head 600 shown in FIG. 6 using the exemplary technique illustrated by FIGS. 7A-7F. The micrograph in FIG. 8 illustrates read head 800 including first shield layer 802, second shield layer 804, and read sensor stack 806 having cap layer 815. Cap layer 815 includes non-magnetic portion 816 and magnetic portions 818A and 818B. As configured, read head 800 may sense magnetic fields according to a read playback sensitivity function that substantially corresponds to the shape of a magnetic bit domains having curved transition boundaries, e.g., such as the read sensitivity function illustrated by plot 500 in FIG. 5.

In some embodiments, the structure and/or composition of a read sensor stack of a read head may be provided such that the read sensitivity playback function associated with the read head corresponds to the shape of magnetic bit domains having at least on curved transition boundary. For example, read sensor stack 606 of read head 600 in FIG. 6 includes cap layer 615 which has magnetic portions 618A, 618B and non-magnetic portion 616 as described previously. However, in some embodiments, the shield geometry of a read head proximate to a read sensor stack may be provided such that the read sensitivity playback function corresponds to the shape of magnetic bit domains having at least on curved transition boundary. Such a configuration may be in addition to, or in alternative to, providing composition and/or structure of one or more layers of a read sensor stack of a read head to allow for a read sensitivity playback function as described.

Figure 9:
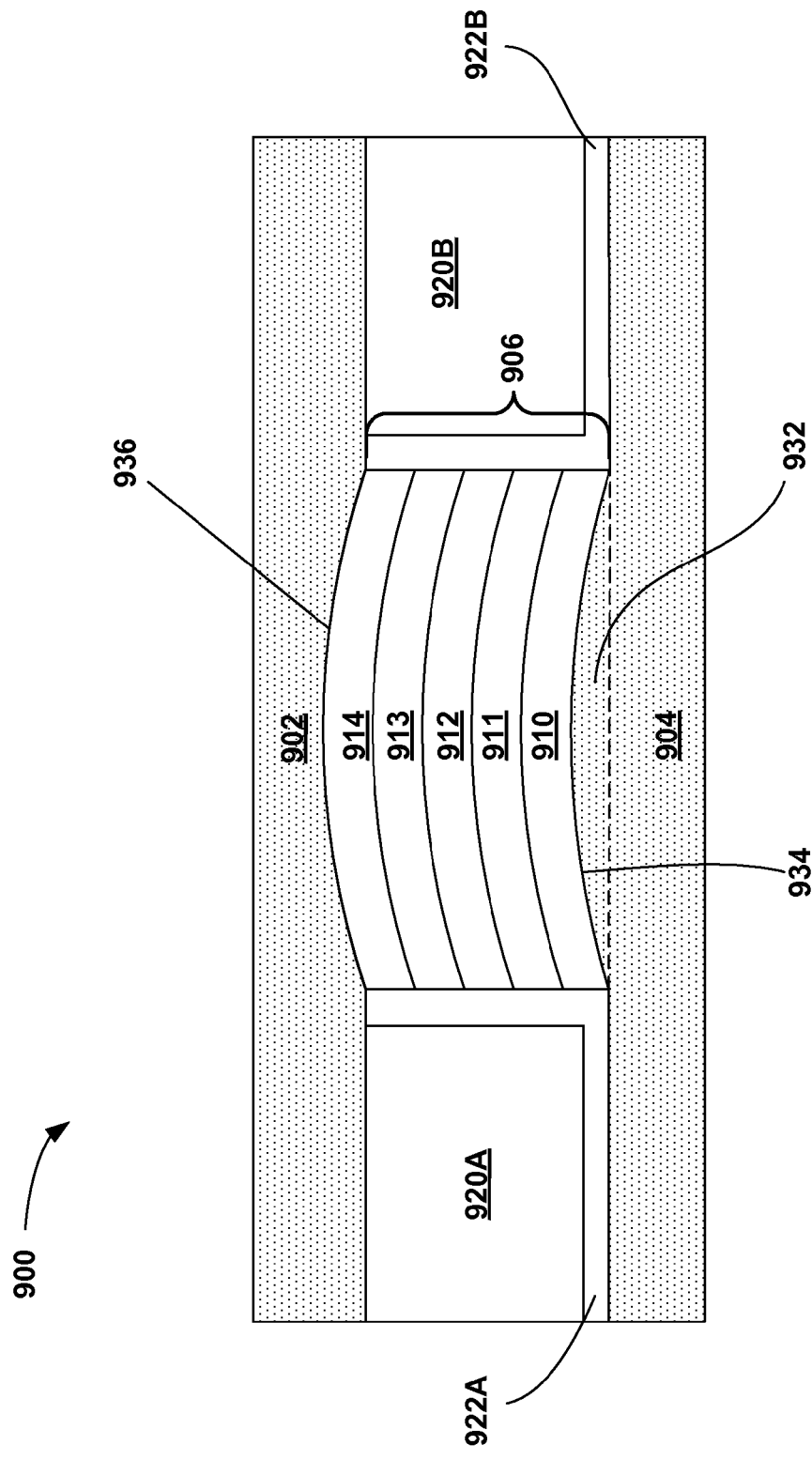
FIG. 9 is a schematic diagram illustrating another example read head according to one embodiment of the disclosure.

FIG. 9 is a schematic diagram illustrating another example read head according to one embodiment of the disclosure. As shown, read head 900 includes first shield layer 902, second shield layer 904, read sensor stack 906, insulator layers 922A, 922B and PM layers 920A, 920B. Insulator layers 922A, 922B and PM layers 920A, 920B are substantially similar to those layers described with respect to read head 600 of FIG. 6.

As illustrated by FIG. 9, the shield geometry of read head 900 proximate to read sensor stack 906 with respect to first shield layer 902 and second shield layer 904 is different that of the configuration of read head 600 in FIG. 6. For instance, second shield layer 904 includes portion 932 forms a curved boundary 934 between read sensor stack 906 and second shield layer 904. As configured, second shield layer 904 may be described as having a curved surface, which may be fabricated using a suitable fabrication process, e.g., by using a process such as that described with respect to FIG. 10.

Read sensor stack 906 includes layers 910-914 which are substantially the same as described with respect to layers 610-614 of read sensor stack 606 of FIG. 6. However, as illustrated by FIG. 9, the structure of read sensor stack 906 differs from that of read sensor stack 606. Particularly, each of the individual layers 910-914 exhibits a curvature consistent with that of curved boundary 934 between read sensor stack 906 and second shield layer 904. The overall structure of read sensor stack 906 exhibits a substantially similar curvature. As a result, the read sensor stack 906 provides for a curved boundary 936 between read sensor stack 906 and first shield layer 902.

Similar to read head 600, read head 900 may be utilized in a magnetic read/write head to read data contained on a magnetic storage medium in which the transition boundaries between magnetic bit domains define a transition curvature, such as, e.g., magnetic data track 250 of FIG. 2B. Read head 900 may fly over the surface of data track 250 to read the data stored on magnetic storage medium by detecting the magnetic fields of the respective magnetic bit domains aligned on data track 250. For example, magnetic read head 900 may provide means for creating a reader playback sensitivity function associated with the magnetic read head 900, where the reader playback sensitivity function substantially corresponding to a shape of the respective magnetic bit domains aligned on the data tracks of a magnetic storage medium. In some embodiments, the read playback sensitivity function may be similar to that represented by plot 500 of FIG. 5.

Although curved boundary 934 of FIG. 9 is shown as a smooth, arcuate boundary it is recognized that a configuration which do not possess such a geometry may also allow for read head 900 to read data contained on a magnetic storage medium in which the transition boundaries between magnetic bit domains define a transition curvature, e.g., by allowing for a read playback sensitivity function similar to that of FIG. 5. In some embodiments, portion 932 of shield layer 904 may protrude in a manner such that all or portions boundary 934 are not arcuate but still may effectively allow read head 900 to adequately detect magnetic bit domains and/or transitions exhibiting curved transition profiles, e.g., according to a reader playback sensitivity function similar that of FIG. 5.

Figure 10A:
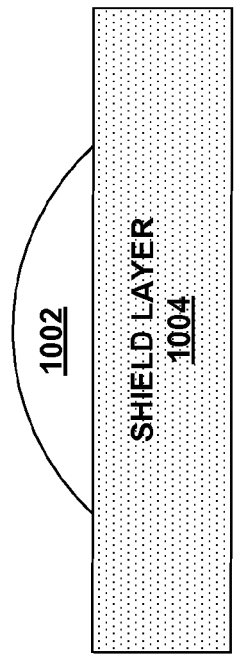
FIGS. 10A-10D illustrate an example technique for fabricating an example shield layer with a curved surface.

FIGS. 10A-10D illustrate an example technique for fabricating an example shield layer with a curved surface, such as shield layer 904 of FIG. 9. As shown in FIG. 10A, a photoresist, such as, a thin photoresist, e.g., 100 nm, may be deposited on shield layer 1004 such that a portion of the surface of shield layer 1004 is covered by photoresist layer 1002. In general, the portion of the surface of shield layer 1004 covered by photoresist layer 1002 roughly corresponds to the area of shield 1004 that will include a curved surface. In some embodiments, photoresist layer 1002 may be deposited such that one or more aspects of the desired curved surface, including, e.g., the geometry of the curved surface of shield layer, may be controlled.

Figure 10B:
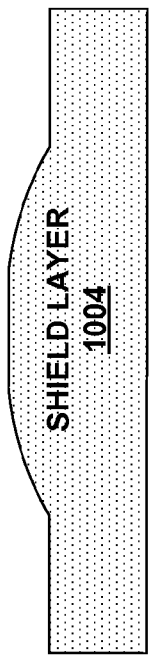

Referring to FIG. 10B, photoresist layer 1002 is baked such that the material of layer 1002 is allowed to flow as desired. At the appropriate time, a dilute oxygen plasma trimming process may be applied to shape the photoresist layer 1002, e.g., similar to that shown in FIG. 10B.

Figure 10C:
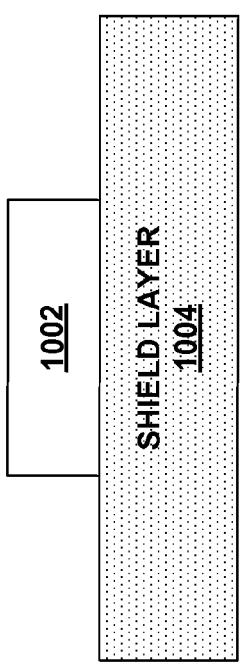

Referring to FIG. 10C, reactive ion beam milling with oxygen plasma trimming may be utilized to gradually remove at least a portion of photoresist layer 1002, in addition to portions of shield layer 1004, as indicated by FIG. 10C.

Figure 10D:
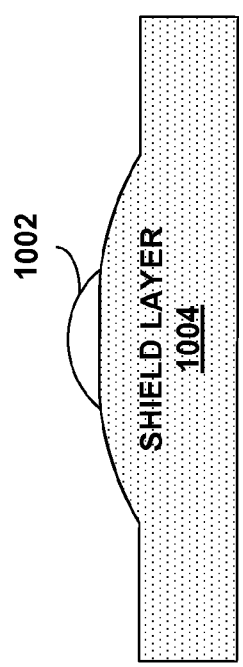

Referring to FIG. 10D, any remaining portion of photoresist layer 1002 may be removed to leave shield layer 1004 with a curved surface. As shown in FIG. 10D, shape of shield layer 1004 is substantially similar to that of shield layer 904 of FIG. 9. When shield layer 1004 in configured as shown in FIG. 10D, shield layer 1004 may be utilized to fabricate a read head with a curved read sensor stack, such as read head 900 of FIG. 9. For example, read sensor layers may be deposited onto to surface of shield layer, resulting in a curved reader sensor stack corresponding to the curved surface of shield layer 1004.

While the example technique of FIGS. 10A-D may be utilized to fabricate a shield layer with a curved surface as described, fabrication of such a shield layer is not limited to such a technique. Rather, any suitable technique for fabricating a shield layer with the same or similar configuration to that of shield layers 904 and/or 1004 may be utilized.

Furthermore, while the curved surface of a shield layer is described as resulting in a curved reader stack, it is recognized that a similar configuration may be achieved by depositing reader stack layers on a shield layer with an indention in the surface rather than a protrusion, such as exhibited by first shield layer 902 of FIG. 9.

Figure 11:
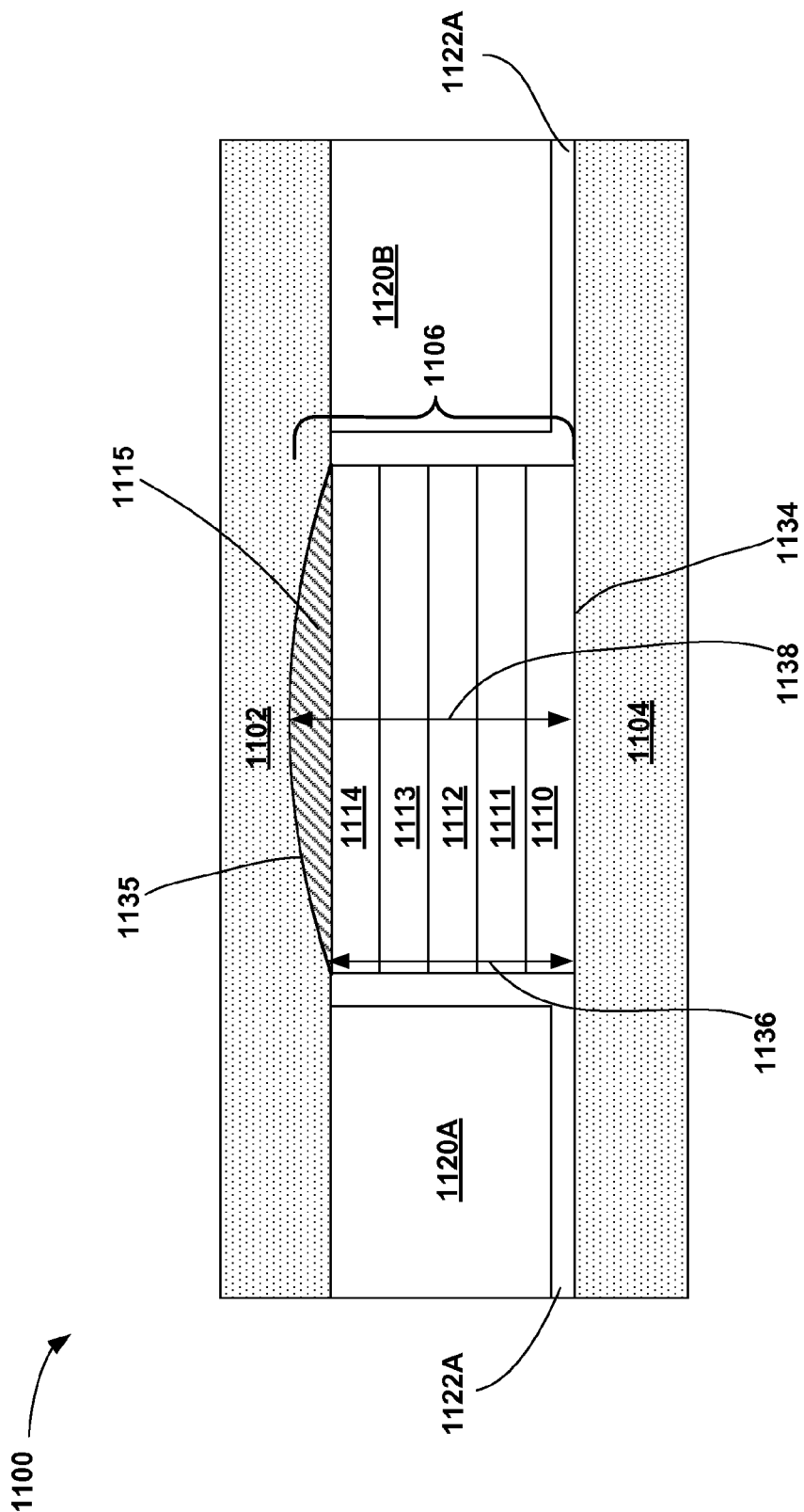
FIG. 11 is a schematic diagram illustrating another example read head according to one embodiment of the disclosure.

FIG. 11 is a schematic diagram illustrating another example read head 1100 according to one embodiment of the disclosure. As shown, read head 1100 includes first shield layer 1102, second shield layer 1104, read sensor stack 1106, insulator layers 1122A, 1122B and PM layers 1120A, 1120B. Insulator layers 1122A, 1122B and PM layers 1120A, 1120B are substantially similar to those layers described with respect to read heads 600 and 900 of FIGS. 6 and 9, respectively.

As illustrated by FIG. 11, read sensor stack 1106 is provided substantially between shield layers 1102 and 1104. Read sensor stack 1106 includes individual layers 1110-1114 which are substantially the same as described with respect to layers 610-614 of read head 600 of FIG. 6. Further, read sensor stack 1106 includes cap layer 1115 proximate to first shield layer 1102. Cap layer 1115 may include any suitable material that allows for a read sensitivity function as described herein. In some examples, cap layer materials may include materials that are substantially nonmagnetic but electrically conductive. For example, cap layer 1115 may include one or more of ruthenium (Ru), chromium (Cr), gold (Au), silver (Ag), and the like.

In general, cap layer 1115 exhibits a curvature along boundary 1135 with first shield layer. As a result, boundary 1135 between cap layer 1115 and first shield layer 1102 exhibits a curvature consistent with the shape of cap layer 1115, unlike boundary 1134 between read sensor stack 1106, which does not exhibit a curvature. Accordingly, the shield geometry is such that the distance between boundary 1135 of first shield layer 1102 and boundary 1134 of second shield layer 1104 varies proximate to read sensor stack 1106. For example, as indicated by FIG. 11, distance 1138 at approximately the center of read sensor stack 1106 is greater than distance 1136 at approximately the edge of read sensor stack 1106.

Similar to read head 600 and read head 900, read head 1100 may be utilized in a magnetic read/write head to read data contained on a magnetic storage medium in which the transition boundaries between magnetic bit domains define a transition curvature, such as, e.g., magnetic data track 250 of FIG. 2B. Read head 1100 may fly over the surface of data track 250 to read the data stored on magnetic storage medium by detecting the magnetic fields of the respective magnetic bit domains aligned on data track 250. For example, magnetic read head 1100 may provide means for creating a reader playback sensitivity function associated with the magnetic read head 1100, the reader playback sensitivity function substantially corresponding to a shape of the respective magnetic bit domains aligned on the data tracks of a magnetic storage medium. In some embodiments, the read playback sensitivity function may be substantially similar to that represented by plot 500 of FIG. 5.

Although the shape of cap layer 1115 of FIG. 9 is shown as resulting in curved boundary 1135 that is a smooth, arcuate boundary, it is recognized that configuration which do not possess such a geometry may also allow for read head 900 to read data contained on a magnetic storage medium in which the transition boundaries between magnetic bit domains define a transition curvature, e.g., by allowing for a read playback sensitivity function similar to that of FIG. 5. In some embodiments, cap layer 1115 of read sensor stack 1106 may be configured in a manner such that all or a portion of boundary 1135 is not arcuate but still may effectively allow read head 1100 to adequately detect magnetic bit domains and/or transitions exhibiting curved transition profiles, e.g., according to a reader playback sensitivity function similar that of FIG. 5. For example, the shape of cap layer 1115 proximate to shield layer 1102 may be similar to one or more linear steps along boundary 1135 such that distance 1138 at approximately the center of read sensor stack 1106 is greater that distance 1136 at approximately the edge of read sensor stack 1106, even though the distance from the edge of the stack to approximately the center may not be continuously increasing as shown in FIG. 11.

Figure 12:
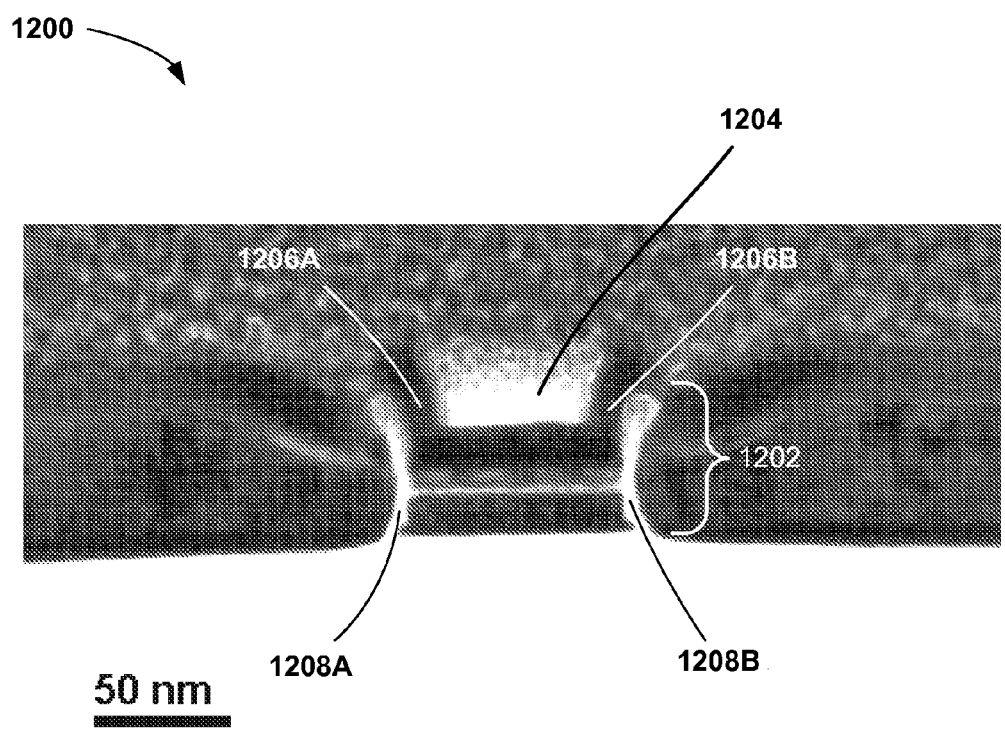
FIG. 12 is a transmission electron microscopy (TEM) micrograph of an example read sensor.

FIG. 12 is a transmission electron microscopy (TEM) micrograph of an example read sensor 1200. Read sensor 1200 includes read sensor stack 1202 including cap layer 1204 similar to that described with respect to FIG. 11. Read sensor also includes insulator layers 1208A and 1208B proximate to sides of read sensor stack 1202. Although shield layers, such as, e.g., shield layers 1102 and 1104 of FIG. 11, are not shown in example of FIG. 12, a shield layer may be formed proximate to cap layer 1204 of read sensor stack 1202 such that the boundary between the read sensor stack 1202 and the shield layer proximate to cap layer 1204 may be curved according to the shape of cap layer 1204. In such a configuration, read sensor 1200 may be utilized in a read head the same or similar as described with respect to read head 1100 of FIG. 11.

Furthermore, in the example of FIG. 12, the reader junction of read sensor 1200 was formed using thin carbon as a hard mask layer. Redeposition of material during the ion milling process to form read sensor stack 1202 results in channels 1206A and 1206B proximate to sides of read sensor stack 1202, and cap layer 1204 in particular. As configured, channels 1206A and 1206B may provide magnetic side-shield for read sensor 1200, e.g., when utilized to sense magnetic fields as described herein.

Various embodiments of the disclosure have been described. These and other embodiments are within the scope of the following claims.

The invention claimed is:

1. A system comprising a magnetically responsive head with a sensor stack disposed between and contacting first and second shields, the sensor stack having a stack width along a first direction that is less than a shield width of each shield along the first direction, the sensor stack comprising a cap layer comprising a non-magnetic portion disposed between first and second magnetic portions, the cap layer continuously extending the stack width along the first direction in contact with the second shield, the non-magnetic portion having a sensitivity width along the first direction that is less than the stack width and shield width.

2. The system of claim 1, further comprising a data storage member having a magnetic storage medium, the magnetic storage medium having a plurality of magnetic bit domains aligned on at least one data track, wherein a transition boundary between respective magnetic bit domains defines a transition curvature, wherein the sensor stack senses a magnetic field of each of the plurality of magnetic bit domains according to a read playback sensitivity, wherein at least the shield layers and read sensor stack are configured to provide the reader playback sensitivity that substantially corresponds to a shape of the respective magnetic bit domains.

3. The system of claim 2, wherein the read playback sensitivity includes a first boundary, wherein the first boundary substantially corresponds to the transition curvature defined by the transition boundary.

4. The system of claim 3, wherein the read playback sensitivity comprises a first boundary that is concave with respect to a transverse axis of the data track, the transverse axis intersecting at least a portion of the read playback sensitivity function.

5. The system of claim 2, wherein the magnetic storage medium is magnetized by a perpendicular magnetic writing head.

6. The system of claim 2, wherein the cap layer of the sensor stack contacts a free layer of the sensor stack.

7. The system of claim 2, wherein the sensor stack comprises magnetic reference and free layers between the first shield and cap layer cap layer.

8. The system of claim 7, wherein the cap layer is curved at a boundary proximate to the first shield layer.

9. The system of claim 1, wherein the magnetic portion contacts the first and second magnetic portions.

10. The system of claim 1, wherein the magnetic portion comprises at least one of nickel-iron or iron-cobalt alloys, wherein the non-magnetic portion comprises at least one of carbon, aluminum oxide, or silicon dioxide.

11. The system of claim 1, wherein the non-magnetic portion has a first magnetic permeability and the magnetic portion has a second magnetic permeability, wherein the first magnetic permeability is less than the second magnetic permeability.

12. An apparatus comprising a magnetically responsive head with a sensor stack disposed between and contacting first and second shields, the sensor stack having a stack width along a cross-track axis that is less than a shield width of each shield along a cross-track axis, the sensor stack comprising a cap layer comprising a non-magnetic portion disposed between first and second magnetic portions, the cap layer continuously extending the stack width along the cross-track axis in contact with the second shield, the non-magnetic portion having a first sensitivity width along the cross-track axis and each magnetic portion having a second sensitivity width along the cross-track axis, the first and second sensitivity width each being less than the stack and shield widths, the first sensitivity width being greater than the second sensitivity width.

13. The apparatus of claim 12, wherein the sensor stack has a read playback sensitivity is approximately symmetrical along a longitudinal axis of the sensor stack, the longitudinal axis being orthogonal to the cross-track axis.

14. The apparatus of claim 13, wherein the read playback sensitivity comprises a first boundary that is concave with respect to the cross-track axis, the cross-track axis intersecting at least a portion of the bit domains.

15. The apparatus of claim 12, wherein the stack width is selected from a range of values from approximately 10 nanometers to approximately 150 nanometers.

16. An apparatus comprising:
   a sensor stack disposed between and contacting first and second shields along a first direction; and
   first and second magnetic layers separated from and positioned on opposite sides of the sensor stack along a second direction, the first and second directions being orthogonal, the sensor stack comprising at least one reference layer proximal a first shield and a cap layer in contact with the second shield, the cap layer comprising a non-magnetic portion disposed between and contacting first and second magnetic portions along the second direction.

17. The apparatus of claim 16, wherein the cap layer defines an asymmetric read sensitivity for the sensor stack.

18. The apparatus of claim 17, wherein the asymmetric read sensitivity comprises a curved boundary, wherein the curved boundary corresponding to a transition curvature of a data track.

19. The apparatus of claim 16, wherein the cap layer is curved at a boundary between the first shield layer such that a distance between the first shield layer and second shield layer varies along the boundary.

20. The apparatus of claim 16, wherein each layer of the sensor stack is continuously curvilinear along the second direction.

* * * * *